US011224137B2

(12) United States Patent
Hsu

(10) Patent No.: US 11,224,137 B2
(45) Date of Patent: Jan. 11, 2022

(54) HINGE MODULE TO OPEN AND CLOSE A DEVICE

(71) Applicant: JARLLYTEC CO., LTD., New Taipei (TW)

(72) Inventor: Yu-Tsun Hsu, New Taipei (TW)

(73) Assignee: JARLLYTEC CO., LTD., New Taipei (TW)

( * ) Notice: Subject to any disclaimer, the term of this patent is extended or adjusted under 35 U.S.C. 154(b) by 20 days.

(21) Appl. No.: 16/686,108

(22) Filed: Nov. 16, 2019

(65) Prior Publication Data

US 2020/0267856 A1    Aug. 20, 2020

(30) Foreign Application Priority Data

Feb. 16, 2019 (TW) ................................. 108105216

(51) Int. Cl.
| | |
|---|---|
| *H05K 5/02* | (2006.01) |
| *F16C 11/04* | (2006.01) |
| *E05D 3/12* | (2006.01) |
| *E05D 3/18* | (2006.01) |
| *H05K 5/00* | (2006.01) |
| *E05D 11/00* | (2006.01) |

(52) U.S. Cl.
CPC ........... *H05K 5/0226* (2013.01); *E05D 3/122* (2013.01); *E05D 3/18* (2013.01); *E05D 11/0081* (2013.01); *F16C 11/04* (2013.01); *H05K 5/0017* (2013.01); *E05Y 2900/606* (2013.01)

(58) Field of Classification Search
CPC ........ E05D 3/122; E05D 3/18; H05K 5/0017; H05K 5/0226
See application file for complete search history.

(56) References Cited

U.S. PATENT DOCUMENTS

| | | | | |
|---|---|---|---|---|
| 8,976,519 | B2* | 3/2015 | Lai ........................ | G06F 1/1679 |
| | | | | 361/679.26 |
| 9,104,375 | B2* | 8/2015 | Lee ....................... | G06F 1/1662 |
| 9,250,733 | B2 | 2/2016 | Lee | |
| 9,377,816 | B2* | 6/2016 | Chen ..................... | G06F 1/1681 |
| 9,791,892 | B2 | 10/2017 | Park | |
| 9,840,861 | B1* | 12/2017 | Maatta ..................... | E05D 1/00 |

(Continued)

FOREIGN PATENT DOCUMENTS

| | | |
|---|---|---|
| CN | 103034293 A | 4/2013 |
| CN | 103576775 A | 2/2014 |

(Continued)

*Primary Examiner* — Rockshana D Chowdhury
*Assistant Examiner* — Douglas R Burtner
(74) *Attorney, Agent, or Firm* — Guice Patents PLLC

(57) ABSTRACT

The present invention relates to a hinge module of a foldable type device, which is connected to two casings for being relatively rotated for being in a folded status or in a unfolded status, each of the casings has a fixed outer casing and a moveable inner casing. The hinge module includes a base and two slide mechanisms. One end of a connection rod of each slide mechanism and one end of the linkage member are respectively pivoted to two pivotal parts at one end of the base; after each inner casing is driven to reversely displace, one end of each plate member is separated from each block part, so as to reversely swing and shift for forming an accommodation space allowing a bent central portion of a flexible monitor to be accommodated.

21 Claims, 16 Drawing Sheets

(56) References Cited

U.S. PATENT DOCUMENTS

| | | | |
|---|---|---|---|
| 10,001,810 B2* | 6/2018 | Yoo | G06F 1/1626 |
| 10,070,546 B1* | 9/2018 | Hsu | H05K 5/0017 |
| 10,394,062 B1* | 8/2019 | Song | G02F 1/133308 |
| 10,423,019 B1* | 9/2019 | Song | G06F 1/1681 |
| 2018/0049329 A1* | 2/2018 | Seo | G06F 1/1641 |
| 2018/0324964 A1* | 11/2018 | Yoo | H05K 1/189 |
| 2020/0117233 A1* | 4/2020 | Ou | E05D 7/00 |
| 2020/0236826 A1* | 7/2020 | Baek | H05K 5/0017 |
| 2020/0253068 A1* | 8/2020 | Cha | G06F 1/1652 |
| 2020/0253069 A1* | 8/2020 | Cha | G09F 9/301 |
| 2020/0323091 A1* | 10/2020 | Nagai | H04M 1/0268 |
| 2020/0341509 A1* | 10/2020 | Wu | G06F 1/1652 |
| 2021/0064098 A1* | 3/2021 | Xiao | H04B 1/3888 |

FOREIGN PATENT DOCUMENTS

| | | |
|---|---|---|
| CN | 105788452 A | 7/2016 |
| CN | 106205385 A | 12/2016 |
| CN | 106255935 A | 12/2016 |

\* cited by examiner

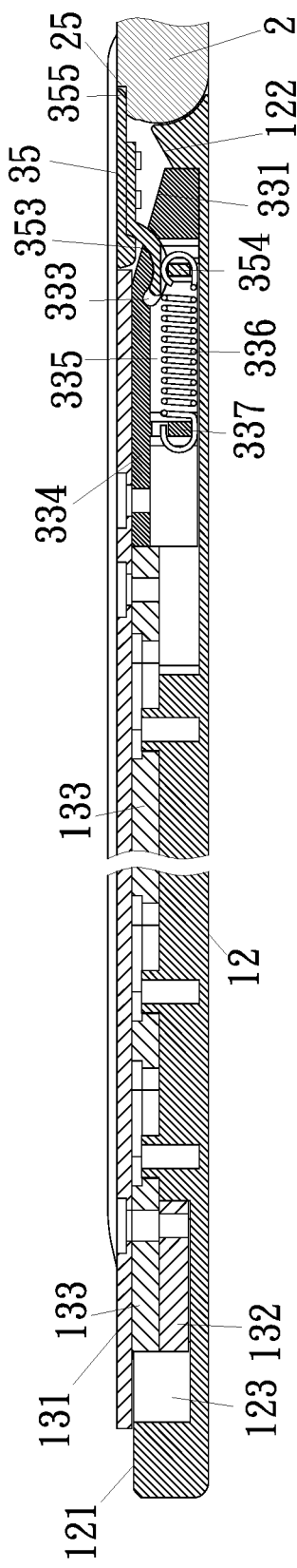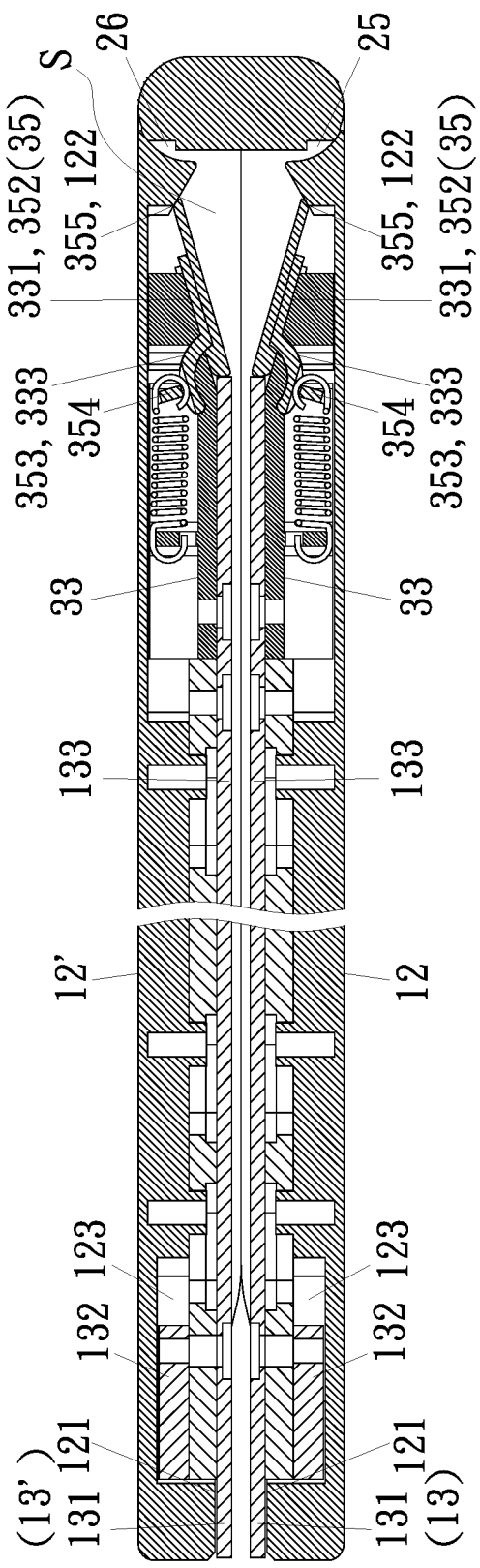

HINGE MODULE TO OPEN AND CLOSE A DEVICE

BACKGROUND OF THE INVENTION

1. Field of the Invention

The present invention relates to hinge, especially to a hinge module for a foldable type device.

2. Description of Related Art

China Patent No. CN105788452A has disclosed a foldable type displayer, which provides a foldable structure with a rotation shaft, a first main body and a third main body of a hinge unit are respectively connected to a first support unit and a second support unit, and the first support unit and the second support unit are combined with a soft display module, thus after the first main body and the third main body are rotated relative to a second main body, the soft display module on the first support unit and the second support unit are stacked with each other. However, a structure allowing the first main body and the third main body to rotate has to be saved in the second main body, so that a gap between two machine frames and allowing the rotation shaft to be accommodated cannot be effectively reduced; as such, the above-mentioned design would cause the whole volume to be large and unsuitable to be adopted in the whole design of an electronic device, moreover, the market trends of requiring the whole volume to be thin and light cannot be satisfied.

China Patent No. CN103576775A, China Patent No. CN106205385A and U.S. Pat. No. 9,250,733B have respectively disclosed a dual-axle type rotation shaft or a structure similar to the dual-axle type for enabling two machine frames to be relatively folded or unfolded; the above-mentioned patents are to utilize a support structure, in which one end part thereof is pivotally connected via an actual shaft and another end part is kept in a moveable status, when the whole foldable type device is in a folded status, each support structure in the two machine frames would be driven by a force applying unit, for example a spring, a tension spring or a magnet, for forming an accommodation space therein, so that a bent central portion of a flexible monitor can be accommodated; when the whole foldable type device is in a flattened status, each of the support structures is served to respectively support the flattened central portion of the flexible monitor. Moreover, China Patent No. CN106255935A has disclosed a foldable type equipment and China Patent No. CN103034293B has disclosed a display system, the two patents respectively utilize one or two connection rods to form a first connection rod for driving a support structure pivoted to an actual shaft to generate a movement, thereby achieving an effects of reducing a gap for accommodating a bent portion of a flexible monitor. The design of compensating folding/unfolding path mechanism are also disclosed in U.S. Pat. No. 9,791,892B and U.S. Ser. No. 10/001,810B, wherein U.S. Pat. No. 9,791,892B can be deemed as a continuous art disclosed in FIG. 16a to FIG. 16c of China Patent No. CN106255935A, and U.S. Ser. No. 10/001,810B has disclosed a machine body (shown as code 220 in FIG. 2 and code 920 of FIG. 9) provided with the compensating folding/unfolding path mechanism, and including a transversal moving plate (shown as code 225 in FIG. 2 and code 921 in FIG. 9), a first connection rod (shown as code 330 in FIG. 2 and code 920 in FIG. 9) and a gear assembly (shown as code 340 in FIG. 10a) working with a guiding unit (shown as code 331 in FIG. 9 and code 341 in FIG. 10a), so that an effect of compensating a folding/unfolding path differentiation can be achieved.

SUMMARY OF THE INVENTION

However, the connecting relations and structures of the components of the compensating folding/unfolding path mechanism disclosed in the above-mentioned patents are very complicated, and a direct pivotal connecting structure is mostly adopted, so that the stable transmission cannot be provided; and during a process of the support structure generating a movement for reducing the gap to accommodate the bent central portion of the flexible monitor, the speed of relative movement for reducing the gap is the same or too slow, so that a force applied for the folding operation is not smooth or the displacing speed of the support structure is not fast enough, the space for accommodating the bent portion of the flexible monitor could not be rapidly formed, thus a situation of causing the flexible monitor to be pulled or squeezed may happen, and wrinkles or separations may generate at the bent central portion of the flexible monitor. Accordingly, the applicant of the present invention has devoted himself to improve the above-mentioned disadvantages existed in the prior art.

One primary objective of the present invention is to provide a hinge module, with the connecting relations and the structural characteristics of a connection rod, a linkage member, a slide member, a support plate member, the linkage member and a middle transmission member, a compensating folding/unfolding path mechanism can be effectively thinned during a process of the whole structure being folded, thereby simplifying required components so as to reduce the production cost. When the whole structure is bent or flattened, with an arc-shaped plate pin of the support plate member performing an arc-like swinging movement relative to an arc-shaped guiding slot of the slide member, a free swinging effect similar to an axis-free seesaw can be generated, thereby maintaining the stability in transmission. As such, the actual pivotal connection adopted in the prior art is not required, thus when the whole structure is bent, an accommodation space can be saved for accommodating a bent central portion of the flexible monitor, and a stable supporting effect is also provided to the central portion of the flexible monitor while being in a flattened status.

For achieving said objective, one technical solution provided by the present invention is to provide a hinge module for a foldable type device, respectively connected to a casing, so that an accommodation space is formed between the two casings when the two casings are relatively rotated for being in a folded status or relatively rotated for being in an unfolded status; wherein each of the casings includes a fixed outer casing and a moveable inner casing capable of sliding relative to the fixed outer casing; the hinge module includes: a base, one end thereof has a first pivotal part, a second pivotal part and a first block part; and a slide mechanism, including a connection rod having one end thereof pivoted with the first pivotal part, wherein an opposite end of the connection rod is connected and fastened with one side of the fixed outer casing; a linkage member, having one end thereof pivoted with the second pivotal part, wherein another end of the linkage member is able to displace on the fixed outer casing, the another end is formed with a first action zone, a pivotal connecting point is formed between two ends of the linkage member; a slide member, connected to one end of the moveable inner casing and capable of moving relative to the side of the fixed outer casing, wherein the slide member is formed with a second action zone and a connection part, and the connection part is formed with an arc-shaped structure; a middle transmission member, pivoted to the side of the fixed outer casing, wherein a third action zone and a fourth action zone are formed between two ends of the middle transmission member, the fourth operation zone interacts with the second operation zone, the third operation zone interacts with the first operation zone, so that the slide member and the linkage member are able to displace towards opposite directions; and a support plate member, having one end thereof formed with a corresponding block zone for being engaged with or separated from the first block part, wherein one side defined at an opposite end of the support plate member has a corresponding arc-shaped structure capable of guiding the arc-shaped structure with a relative arc-like sliding means, so that the support plate member is able to be driven by the slide member to slide for swinging and shifting relative to the slide member, and the moveable inner casing is driven by the slide member for allowing an edge defined at an opposite end of the moveable inner casing to retract or enter a recess part formed on the fixed outer casing.

BRIEF DESCRIPTION OF THE DRAWINGS

The present invention will be apparent to those skilled in the art by reading the following detailed description of a preferred embodiment thereof, with reference to the attached drawings, in which:

FIG. 4-1 is an exploded view illustrating the hinge module and the hinge of FIG. 3 being further detached;

FIG. 4-2 is an enlarged view illustrating each of the connection rods and the base housing shown in FIG. 3 being further detached;

FIG. 7 is a cross sectional view of FIG. 5 taken along an A-A' line;

FIG. 8 is a cross sectional view of FIG. 7 after being bent according to the present invention;

FIG. 13-1 is a schematic view illustrating the slide mechanism wherein the first action zone formed as the elongated guiding slot working with the third action zone formed as the column, and the second action zone formed as the column working with the fourth action zone formed as the elongated guiding slot according to one embodiment of the present invention;

FIG. 13-2 is a schematic view illustrating the slide mechanism wherein the first action zone formed as the elongated guiding slot working with the third action zone formed as the column, and the second action zone formed as the gear rack working with the fourth action zone formed as the teeth-shaped structure according to one embodiment of the present invention;

FIG. 13-3 is a schematic view illustrating the slide mechanism wherein the first action zone formed as the column working with the third action zone formed as the elongated guiding slot, and the second action zone formed as the column working with the fourth action zone formed as the elongated guiding slot according to one embodiment of the present invention;

FIG. 13-4 is a schematic view illustrating the slide mechanism wherein the first action zone formed as the gear rack working with the third action zone formed as the teeth-shaped structure, and the second action zone formed as the column working with the fourth action zone formed as the elongated guiding slot according to one embodiment of the present invention;

FIG. 13-5 is a schematic view illustrating the slide mechanism wherein the first action zone formed as the column working with the third action zone formed as the elongated guiding slot, and the second action zone formed as the elongated guiding slot working with the fourth action zone formed as the column according to one embodiment of the present invention;

FIG. 13-6 is a schematic view illustrating the slide mechanism wherein the first action zone formed as the column working with the third action zone formed as the elongated guiding slot, and the second action zone formed as the gear rack working with the fourth action zone formed as the teeth-shaped structure according to one embodiment of the present invention;

FIG. 13-7 is a schematic view illustrating the slide mechanism wherein the first action zone formed as the gear rack working with the third action zone formed as the teeth-shaped structure, and the second action zone formed as the elongated guiding slot working with the fourth action zone formed as the column according to one embodiment of the present invention;

FIG. 13-8 is a schematic view illustrating the slide mechanism wherein the first action zone formed as the gear rack working with the third action zone formed as the teeth-shaped structure, and the second action zone formed as the gear rack working with the fourth action zone formed as the teeth-shaped structure according to one embodiment of the present invention;

DETAILED DESCRIPTION OF THE PREFERRED EMBODIMENT

Figure 1:
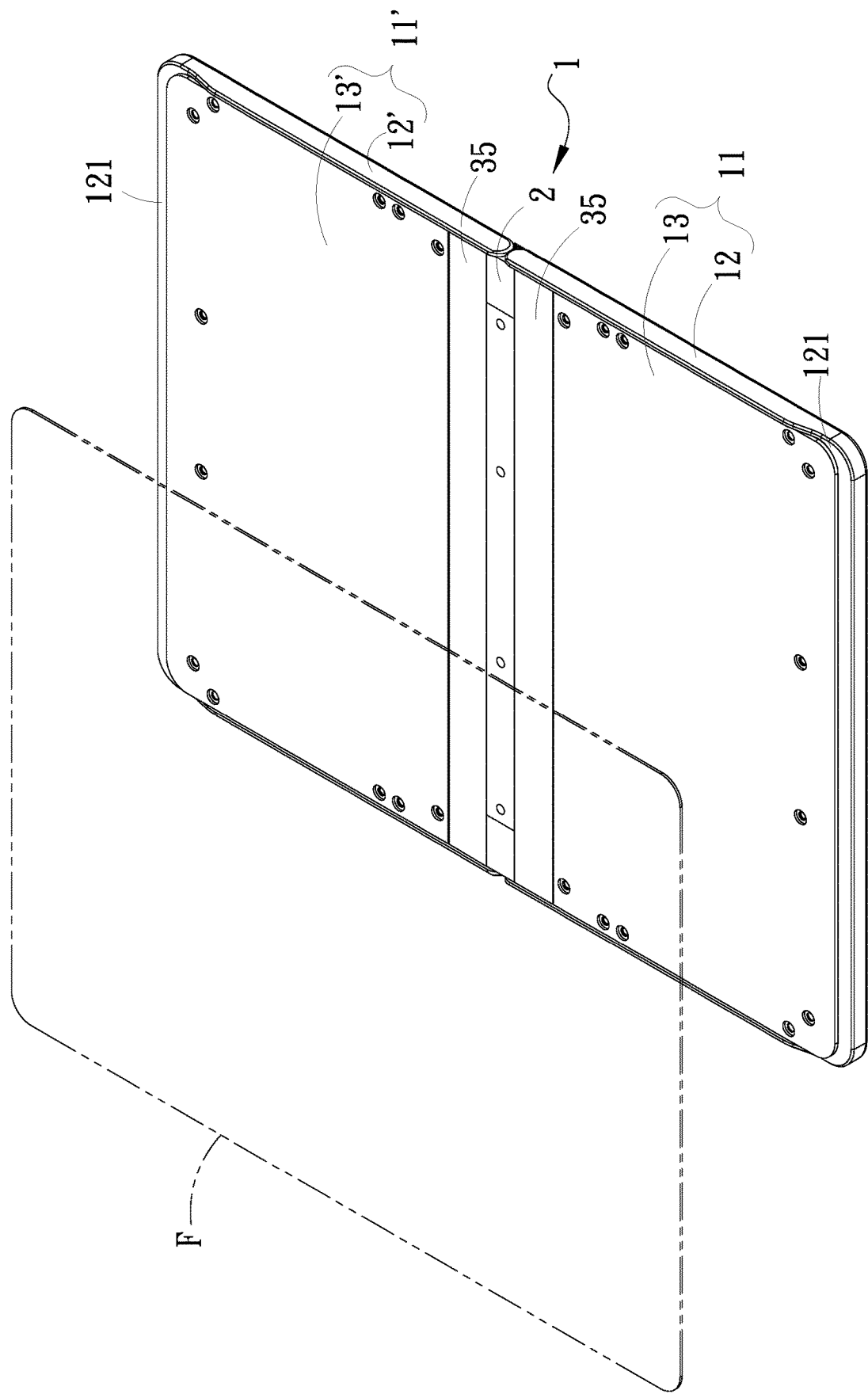
FIG. 1 is a perspective view illustrating the assembly of the hinge module being connected to the two casings according to the present invention, wherein the flexible monitor being detached and shown in dashed lines.

Please refer from FIG. 1 to FIG. 20, the present invention discloses a hinge module 1 for a foldable type device. Two opposite ends of the hinge module 1 are respectively connected to a casing 11 and another casing 11', so that the casing 11 and the another casing 11' are able to be relatively rotated for being in a folded status and an accommodation space S is defined between the casing 11 and the another casing 11', or able to be oppositely rotated for being in an unfolded status, wherein a flexible monitor F is disposed at the same sides of the hinge module 1 and each of the casings 11, 11', so that the flexible monitor F can be correspondingly bent or flattened, and the accommodation space S is able to accommodate and support a bent portion of the flexible monitor F while the whole structure is in a bent status. Wherein, the casing 11 includes a fixed outer casing 12 and a moveable inner casing 13 capable of sliding relative to the fixed outer casing 12. The hinge module 1 includes a base 2 and a slide mechanism 3. One end of the base 2 has a first pivotal part 21, a second pivotal part 22 and a first block part 25. The slide mechanism 3 has a connection rod 31, a linkage member 32, a slide member 33, a middle transmission member 34 and a support plate member 35, wherein connecting relations of the above-mentioned components are provided as follows.

Figures 1, 4:
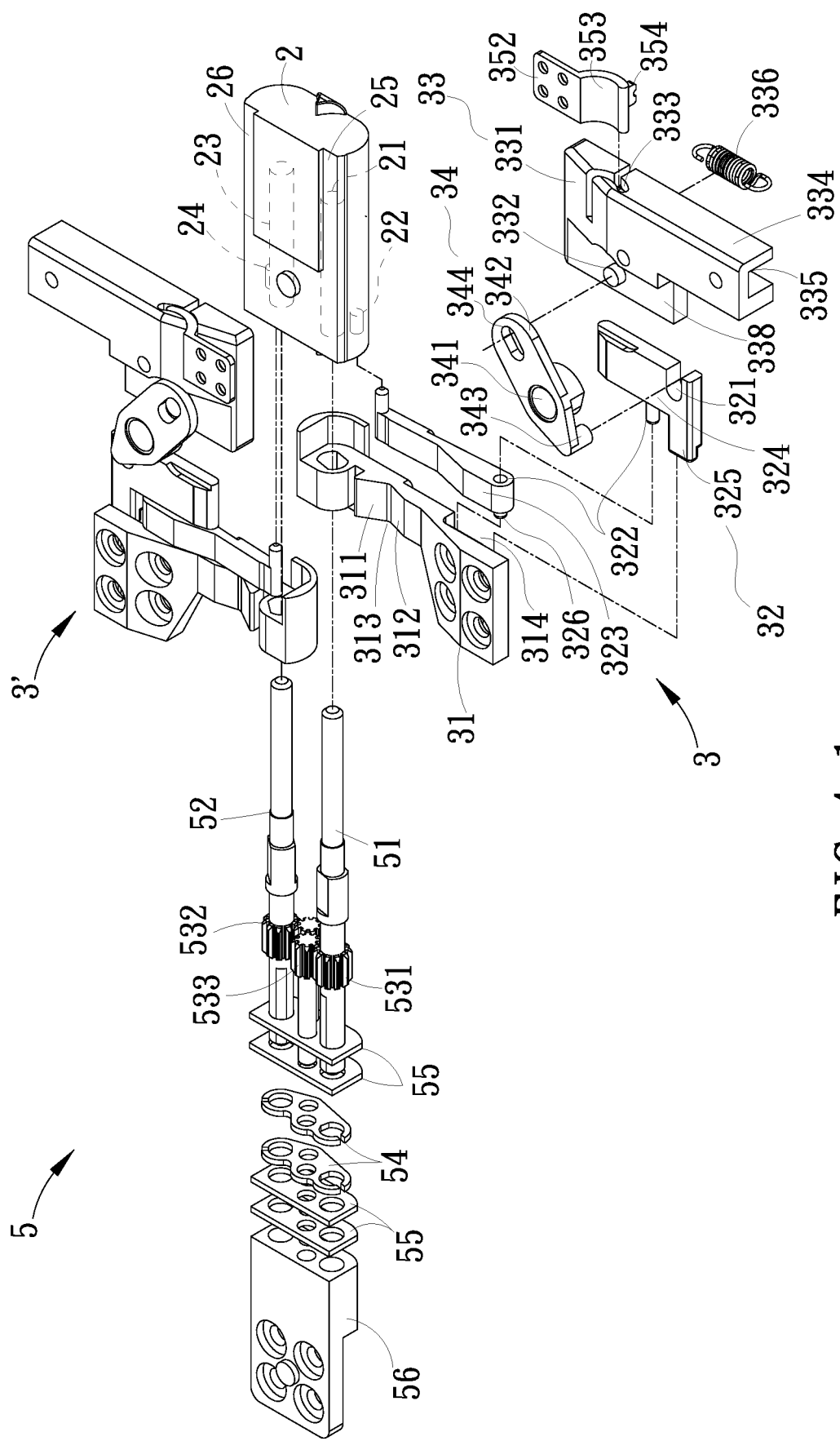
Figures 2, 4:
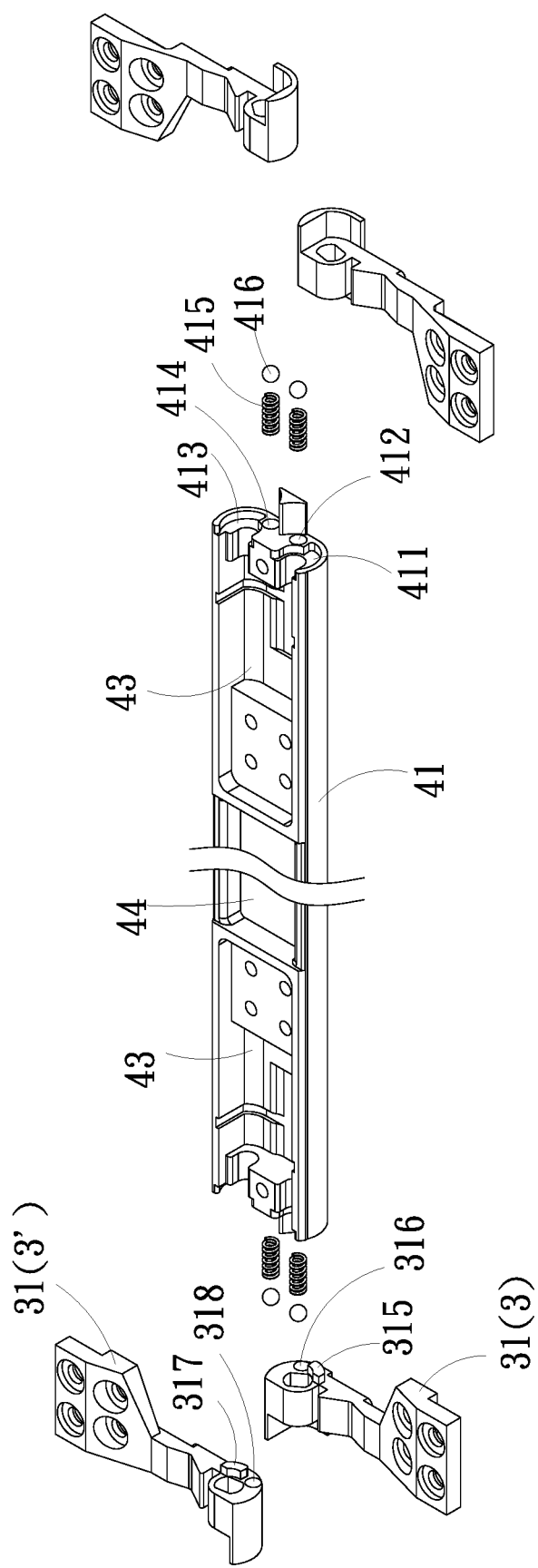
Figure 15:
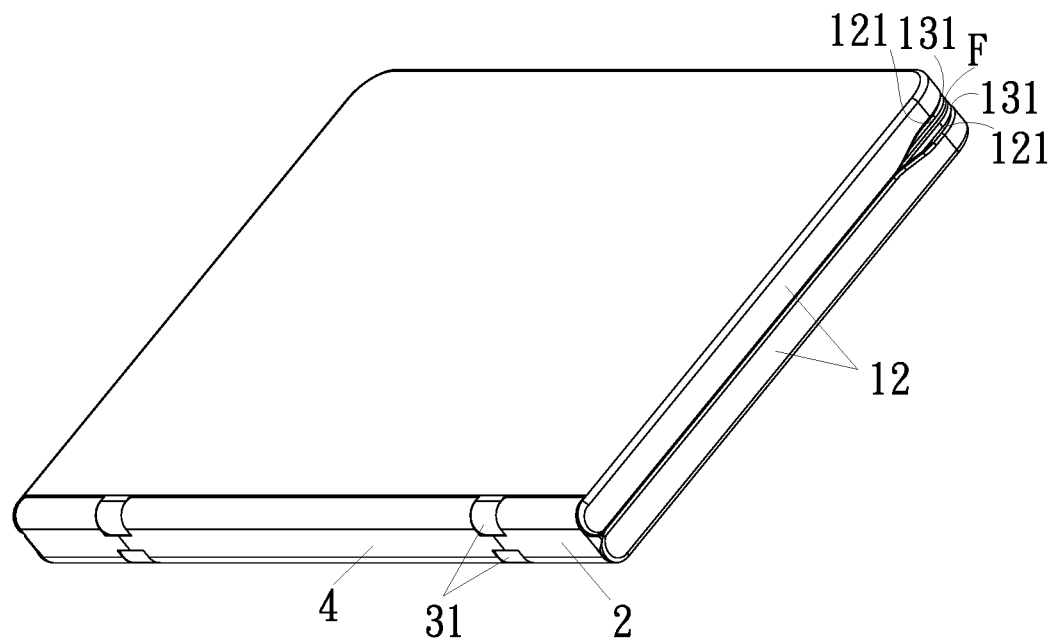
FIG. 15 is a perspective view illustrating the whole structure of the present invention being in a folded status.
Figure 16:
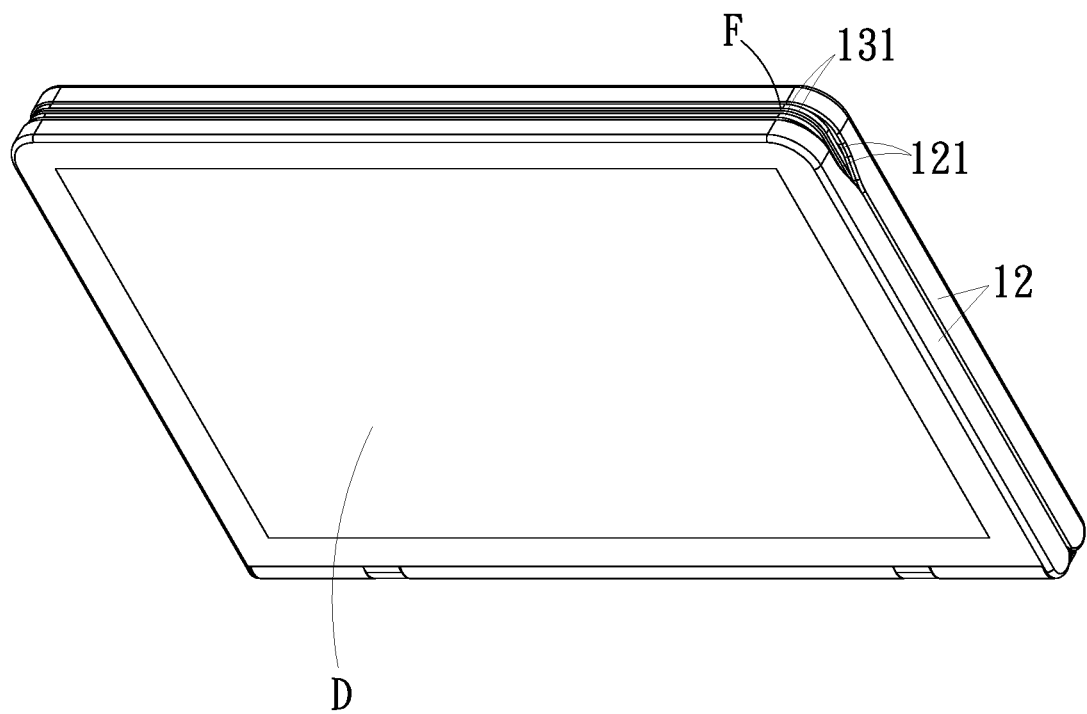
FIG. 16 is another perspective view illustrating the whole structure of the present invention being in the folded status.
Figure 17:
FIG. 17 is a left side view illustrating the whole structure of the present invention being in the unfolded status, wherein the flexible monitor being shown in dashed lines, and the right side view not being provided because the whole structure in the right side being the same.
Figure 18:
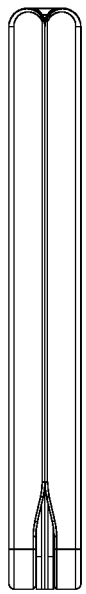
FIG. 18 is still another perspective view illustrating the whole structure of the present invention being in the folded status.

Based on what has been disclosed above, one end of the connection rod 31 is connected to a pivotal shaft, so that the pivotal shaft is combined with the end of the connection rod 31 so as to be formed as an integrated structure, or as shown in FIG. 4-1, a first shaft 51, formed as a detachable structure, is pivoted with the first pivotal part 21, and an opposite end of the connection rod 31 is connected to and fastened on a lateral wall surface of the fixed outer casing 12. One end of the linkage member 32 is connected to a pivotal shaft (the connecting means is the same as the connection rod 31 being connected to the pivotal shaft, thus no further illustration is provided), thereby being pivoted with the second pivotal part 22. Another end part of the linkage member 32 is able to move relative to the fixed outer casing 12, thereby being able to slide along a rib structure formed at one side defined on a lateral wall surface of the fixed outer casing 12, so as to achieve a stable sliding operation, the another end part thereof is further formed with a first action zone 321, a pivotal connecting point 322 is formed between two ends of the linkage member 32, thereby allowing a movement to be performed in a limited space. The slide member 33 is connected to one end of the moveable inner casing 13 and capable of displacing relative to the side of the fixed outer casing 12, and also capable of sliding along an opposite side of the rib structure, so as to achieve a stable sliding operation. The slide member 33 is formed with a second action zone 322 and a connection part 334, and the connection part 334 has an arc-shaped structure 333. The middle transmission member 34 is pivoted and positioned on the lateral wall surface of the fixed outer casing 12 via a pivot 341, and a third action zone 343 and a fourth action zone 344 are formed between two end parts of the middle transmission member 34. The fourth operation zone 344 interacts with the second operation zone 332, the third operation zone 343 interacts with the first operation zone 321, so that the slide member 33 and the linkage member 32 are able to displace towards opposite directions. One end of the support plate member 35 is formed with a corresponding block zone 355 which can be engaged with or separated from the first block part 23, one side defined at an opposite end of the support plate member 35 has a corresponding arc-shaped structure 353 capable of guiding the arc-shaped structure 333 with a relative arc-like sliding means, so that the support plate member 35 can be driven by the slide member 33 to slide for swinging and shifting relative to the slide member 33, and the moveable inner casing 13 is driven by the slide member 33 for allowing an edge defined at an opposite end of the moveable inner casing 13 to retract or enter a recess part 121 formed on the fixed outer casing 12; accordingly, when the thinned foldable type device is in a folded status, a user can easily unfold the foldable type device via the recess part 121 (as shown in FIG. 15, FIG. 16 and FIG. 18) formed at an edge of the casing 11.

Based on what has been disclosed above, the first block part 25 is formed as a stepped surface and arranged at one end of the base 2, thus after the moveable inner casing 13 is driven to move towards the base 2, the corresponding block zone 355 of the shifted support plate member 35 is able to be connected to the first block part 25 of the base 2, so that the swinging movement of the support plate member 35 can be restrained, and the base 2, the support plate member 35 and the moveable inner casing 13 can be aligned at the same side; on the other hands, after the moveable inner casing 13 is driven to backwardly displace, the corresponding block zone 355 is separated from the first block part 25, so that the support plate member 35 is able to reversely swing and shift so as to form the accommodation space S.

As shown from FIG. 5 to FIG. 12, after the corresponding block zone 355 of the support plate member 35 is separated from the first block part 25 or before connected to the first block part 25, a supporting effect is required, thus one end of the fixed outer casing 12 is formed with a guiding surface 122 and one end of the slide member 33 is formed with an inclined surface 331, one side of the connection rod 31 is formed with a guiding surface 311 at the end close to the connection rod 31 and a support surface 312 is formed and adjacent to the guiding surface 311, so that a technical means of forming a concave slot 313 having an included angle between the support surface 312 and the guiding surface 311 is achieved. Accordingly, during a process of the support plate member 35 swinging and shifting, the corresponding block zone 355 thereof is sequentially abutted and leaned against each of the guiding surfaces 311, 112, the support surface 312 and the inclined surface 331, thereby forming a plurality of contact surfaces to share loads and serve to homogenously support.

For enabling the casing of the present invention to be thinned, the arc-shaped structure 333 of the connection part 334 is formed as an arc-shaped guiding slot, the arc-shaped guiding slot is inwardly recessed from a lateral surface of the slide member 33 and penetrates the inclined surface 331. The connection part 344 further has a concave slot 335, a recovery unit 336 and a partition wall 337. The concave slot 355 is served to receive the recovery unit 366 and connected to the arc-shaped structure (the arc-shaped guiding slot) 333. The partition wall 337 is served to partition an inner space of the concave slot 335, the corresponding arc-shaped structure 353 is formed as an arc-shaped plate pin which protrudes out from one side of the support plate member 35 and is guided into the arc-shaped structure (the arc-shaped guiding slot) 333, a block piece 354 is protruded out from one side of the corresponding arc-shaped structure (the arc-shaped plate pin) 353 and guided into the concave slot 335, so that two ends of the recovery unit 336 are respectively connected to the block piece 354 and the partition wall 337; as such, after the corresponding block zone 355 of the support plate member 35 is separated from the first block part 25, an elastic recovering effect provided by the recovery unit 336 can be used for assisting the support plate member 35 to swing and shift, and a stable sliding movement can be achieved through the arc-shaped plate pin working with the arc-shaped guiding slot; the arc-shaped plate pin can be combined with the support plate member 35 so as to be formed as an integrated structure, or a connection sheet 352 disposed at one end of the arc-shaped plate pin can be detachably combined at one side of the support plate member 35.

For enabling the slide mechanism of the present invention to perform a stable movement in the limited space defined inside the thinned casing, the linkage member 32 further has a linkage auxiliary rod 323 and a linkage plate 324 capable of moving relative to the fixed outer casing 12, the first action zone 321 is disposed on the linkage plate 324, one end of the linkage auxiliary rod 323 is pivoted with the second pivotal part 22, the pivotal connecting point 322 is arranged at a location defined at a pivotal connection location where an opposite end of the linkage auxiliary rod 323 being pivoted with one side of the linkage plate 324, another side of the linkage plate 324 is protruded with a wing sheet 325 so as to be guided to a lateral guiding slot 314 at an opposite end part of the connection rod 31; moreover, a convex shaft 326 is protruded from an opposite end part of the linkage auxiliary rod 323, the convex shaft 326 is guided into the lateral guiding slot 314 at the opposite end part of the connection rod 31, the convex shaft 326 and the pivotal connecting point 322 are arranged at a same rotating central line, and the convex shaft 326 is arranged to be parallel to the wing sheet 325. Accordingly, through the convex shaft 326 and the wing sheet 325 both sliding in the lateral guiding slot 314 of the connection rod 31, the stability and a load sharing effect can be provided.

Figure 3:
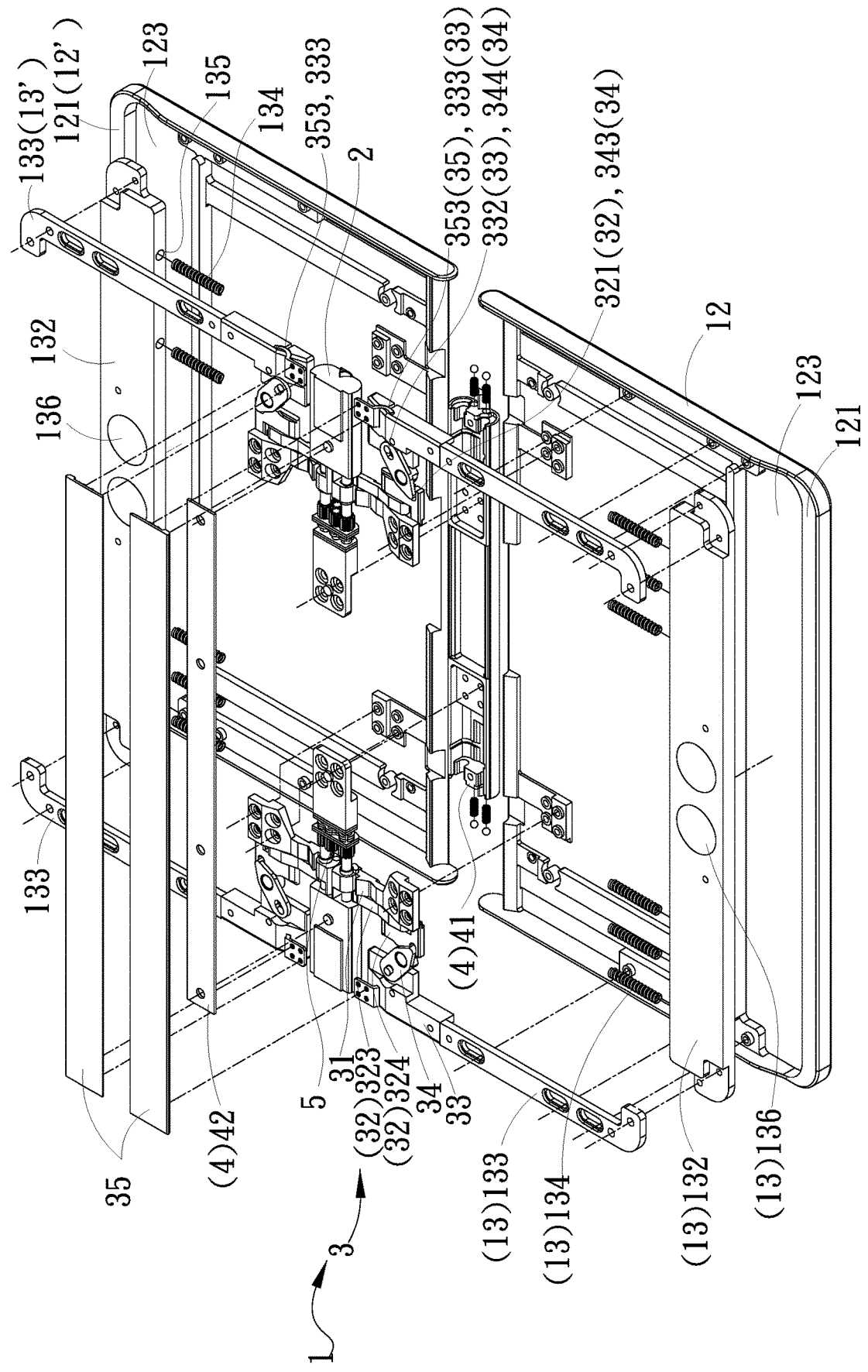
FIG. 3 is an exploded view illustrating the assembling components, the base, the extending base being respectively detached from the hinge module of the two casings shown in FIG. 2 according to the present invention.

As shown in FIG. 3, and from FIG. 5 to FIG. 12, a position limiting concave slot 123 is formed at an opposite end part of the fixed outer casing 12, the recess part 121 is arranged at an opposite end of a slot opening of the position limiting concave slot 123 and formed as a gradually-altered stepped surface. The moveable inner casing 13 further has a transversal moving plate 131 having edge frames 132, 133 and a plurality of elastic units 134; one end of the transversal moving plate 131 is connected to the slide member 33, so that an opposite end surface of the slide member 33 is adjacent to an end surface of the edge frame 133 of the transversal moving plate 131, the elastic units 134 are respectively disposed in a plurality of receiving holes 135 formed on the edge frame 132, thereby allowing the edge frame 132 to reciprocally displace in the position limiting concave slot 123 in an elastically sliding means, thus an edge at an opposite end of the transversal moving plate 131 can moveably enter or retract from the recess part 121.

Accordingly, the fixed outer casing 12 is able to protect the moveable inner casing 13, and a shielding effect is also provided.

A third pivotal part 23, a fourth pivotal part 24 and a second block part 26 are further formed at an opposite end of the base 2. The second block part 26 is formed as a stepped surface and arranged at the opposite end of the base 2, so that the third pivotal part 23, the fourth pivotal part 24 and the second block part 26, the first pivotal part 21, the second pivotal part 22 and the first block part 25 are symmetrically arranged at two ends of the base 2, respectively. The hinge module 1 further includes another slide mechanism 3'. The another slide mechanism 3' and the slide mechanism 3 have corresponding structures and are symmetrically arranged at two ends of the base 2; wherein the another casing 11' and the casing 11 have corresponding structures and are symmetrically arranged at two ends of the hinge module 1; wherein an extending base 4 is further disposed between the casing 11 and the another casing 11'; please refer to FIG. 4-2, a lateral end surface of the extending base 4 is formed with a first position limiting slot 411 and a first hole 412, the end surface of the connection rod 31 is correspondingly formed with a first protrusion 315 and a first corresponding hole 316, a spring 415 and a roller 416 interacting with the spring 415 are received in the first hole 412, the roller 416 is able to be positioned in the first corresponding hole 316, the first protrusion 315 is guided into for being moveably positioned in the first position limiting slot 411; as such, during the end of the connection rod 31 rotating relative to the end of the extending base 4 and through a rotation limiting range defined between two opposite slot wall surfaces of first position limiting slot 411, the roller 416 is able to contact the end surface of the connection rod 31 in a rolling means via an elastic action force of the spring 415 till entering the first corresponding hole 316, thereby forming a positioning effect.

Figure 2:
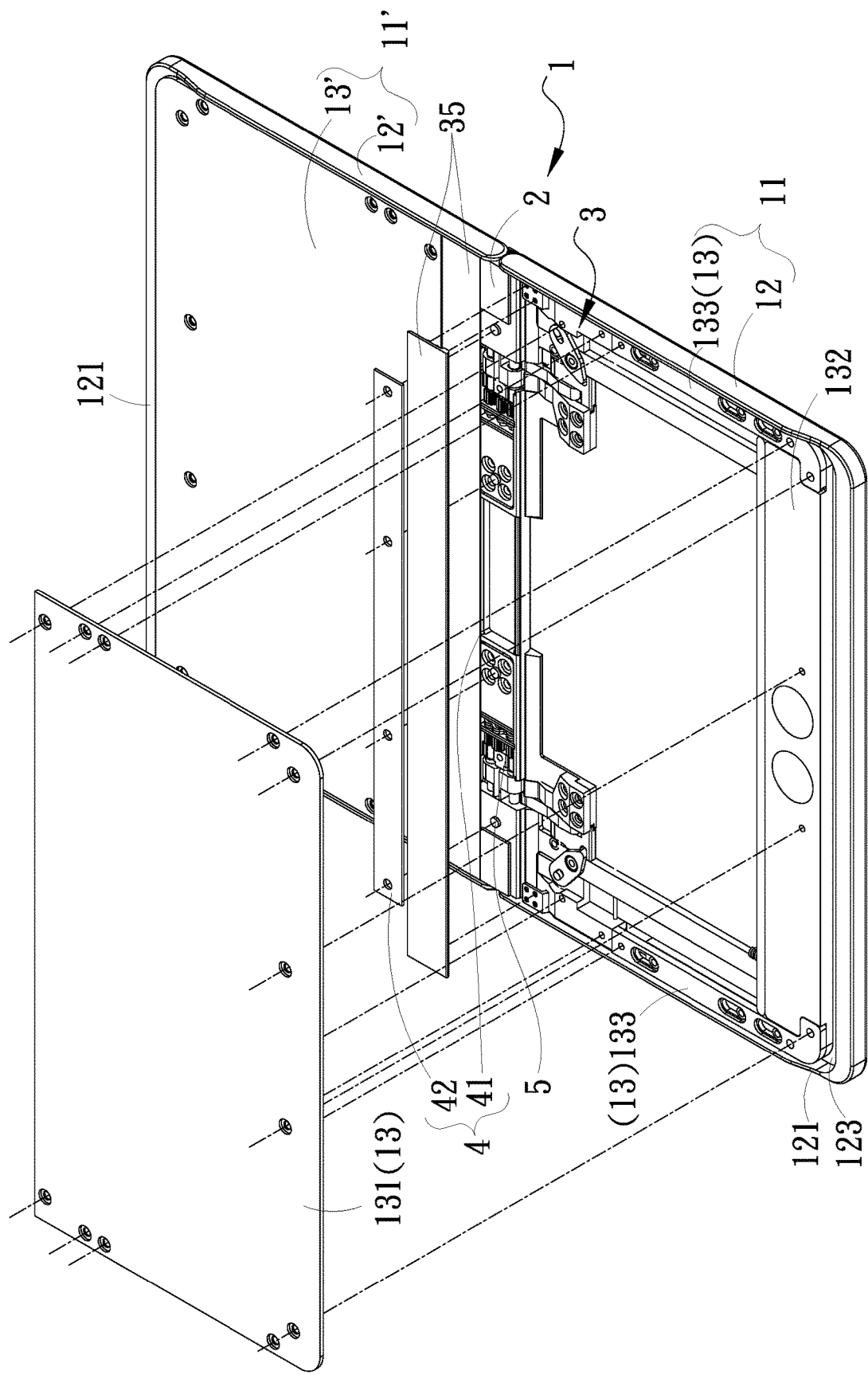
FIG. 2 is a schematic view illustrating the transversal moving plate, the support plate member and the cover plate being detached from one of the casings shown in FIG. 1.

Based on what has been disclosed above, a base housing 41 and a cover plate 42 covering the base housing 41 are further disposed in the extending base 4; the base housing 41 is concavely formed with at least one installation slot 43 and at least one accommodation slot 44, the at least one installation slot 43 is able to correspondingly receive at least one hinge 5, the at least one accommodation slot 44 is able to accommodate at least one electric wiring and allows the at least one electric wiring to pass, at least one notch (as shown in FIG. 2 and FIG. 3) is respectively formed on the guiding surface 122 of each of the casings 11, 11' corresponding to the at least one accommodation slot 44, thereby allowing the at least one electric wiring to be connected to a circuit module disposed in each of the casings 11, 11'. As shown in FIG. 4-1, the at least one hinge 5 further has a first shaft 51, a second shaft 52, a first gear 531, a second gear 532, at least one middle gear 533, a plurality of torsion units 54, a plurality of connecting units 55, 56; the first gear 531 is coaxially combined with the first shaft 51, the second gear 532 is coaxially combined with the second shaft 52, the at least one middle gear 533 is arranged between the first gear 531 and the second gear 532, thereby forming a gear engaging and a synchronously operating status; a rotation axis line of the first shaft 51, a rotation axis line of the second shaft 52 and a rotation axis line of the at least one middle gear 533 are arranged in a parallel status, and the first shaft 51, the second shaft 52 and the at least one middle gear 533 respectively sleeve with the plurality of torsion units 54 and the plurality of connecting units 55, 56, so that a stable assembling status is established, and effects of synchronously rotating and generating torsions are provided, and the at least one hinge 5 can be fastened in the at least one installation slot 43 through the connecting unit 56.

As shown in FIG. 4-2, a second position limiting slot 413 and a second hole 414 are formed on a lateral surface defined at an opposite end of the extending base 4, a second protrusion 317 and a second corresponding hole 318 are correspondingly formed on the end surface of the connection rod 31 of the another slide mechanism 3', a spring 415 and roller 416 interacting with the spring 415 are received in the second hole 414, the roller 416 is able to be positioned in the second corresponding hole 318, the second protrusion 317 is guided into the second positioning limiting slot 413 in a sliding means; during the end of the connection rod 31 of the another slide mechanism 3' rotating relative to an opposite end of the extending base 4, through a rotation limiting range defined between two opposite slot wall surfaces of the second position limiting slot 413, the roller 416 is able to contact the end surface of the connection rod 31 of the another slide mechanism 3' in a rolling means via an elastic effect of the spring 415 till entering the second corresponding hole 318, thereby forming a positioning effect.

Figures 19, 20:
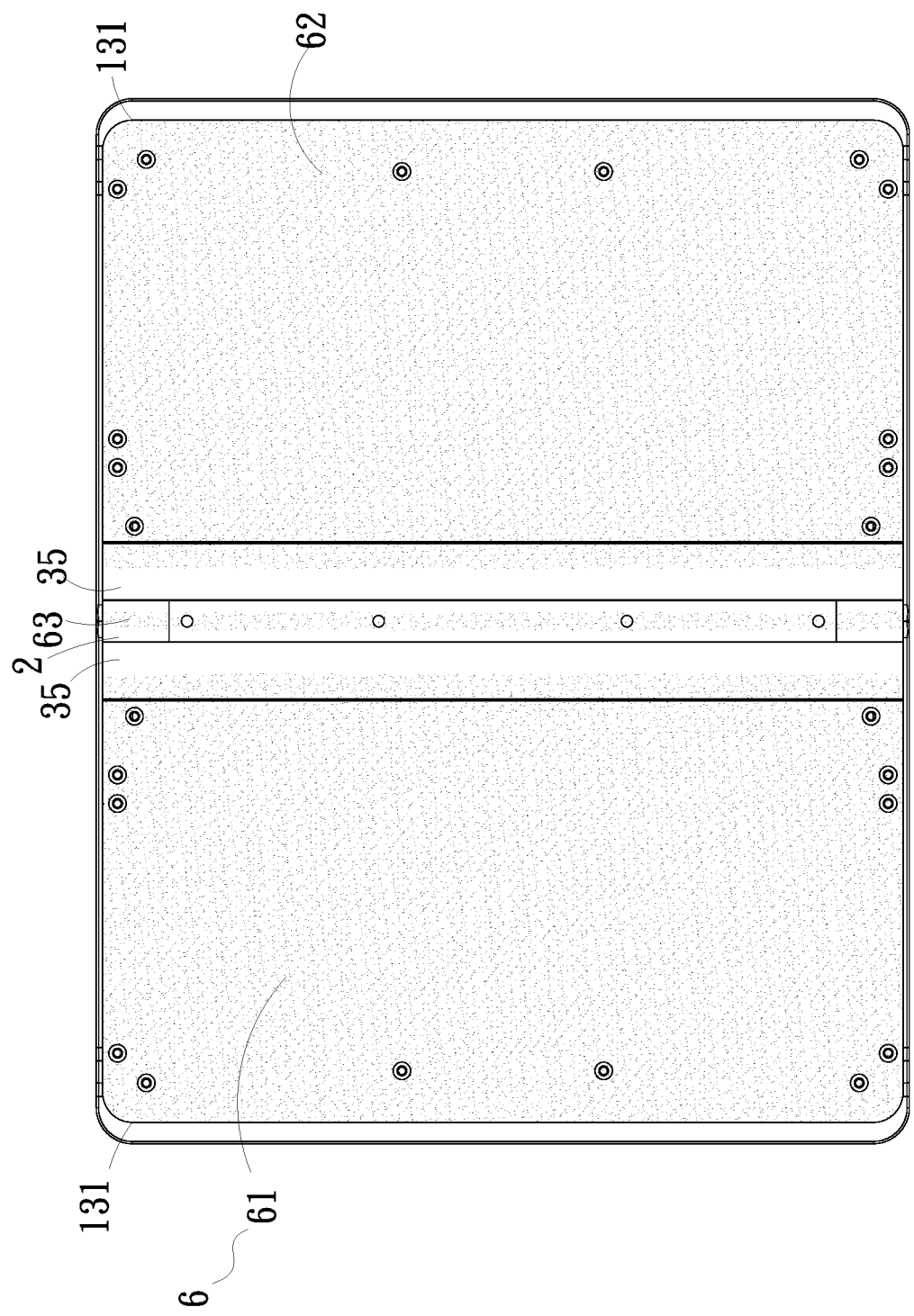
FIG. 19 is a front side view illustrating the whole structure of the present invention being in the unfolded status, wherein the flexible monitor being shown in dashed lines, and the rear side view not being provided because the whole structure in the rear side being the same.
FIG. 20 is a top view illustrating an adhering layer being provided according to the present invention.

As shown in FIG. 20, an adhering layer 6 is further provided between the flexible monitor F and the same sides of the moveable inner casing 13 of the casing 11, the moveable inner casing 13' of the casing 11', the support plate members 35 of the slide mechanisms 3, 3' and the base 2; the adhering layer 6 has a first adhering zone 61, a second adhering zone 62 and a third adhering zone 63; the first adhering zone 61 is provided at one side of the moveable inner casing 13 of the casing 11 and a partial portion at one side of the support plate member 35 of the slide mechanism 3, the second adhering zone 62 is provided at one side of the moveable inner casing 13' of the another casing 11' and a partial portion at one side of the support plate member 35 of the another slide mechanism 3', and the third adhering zone 63 is provided at a central portion at one side of the base 2, thereby allowing two opposite end portions defined at one side of the base 2 not provided with the adhering layer 6.

Figure 5:
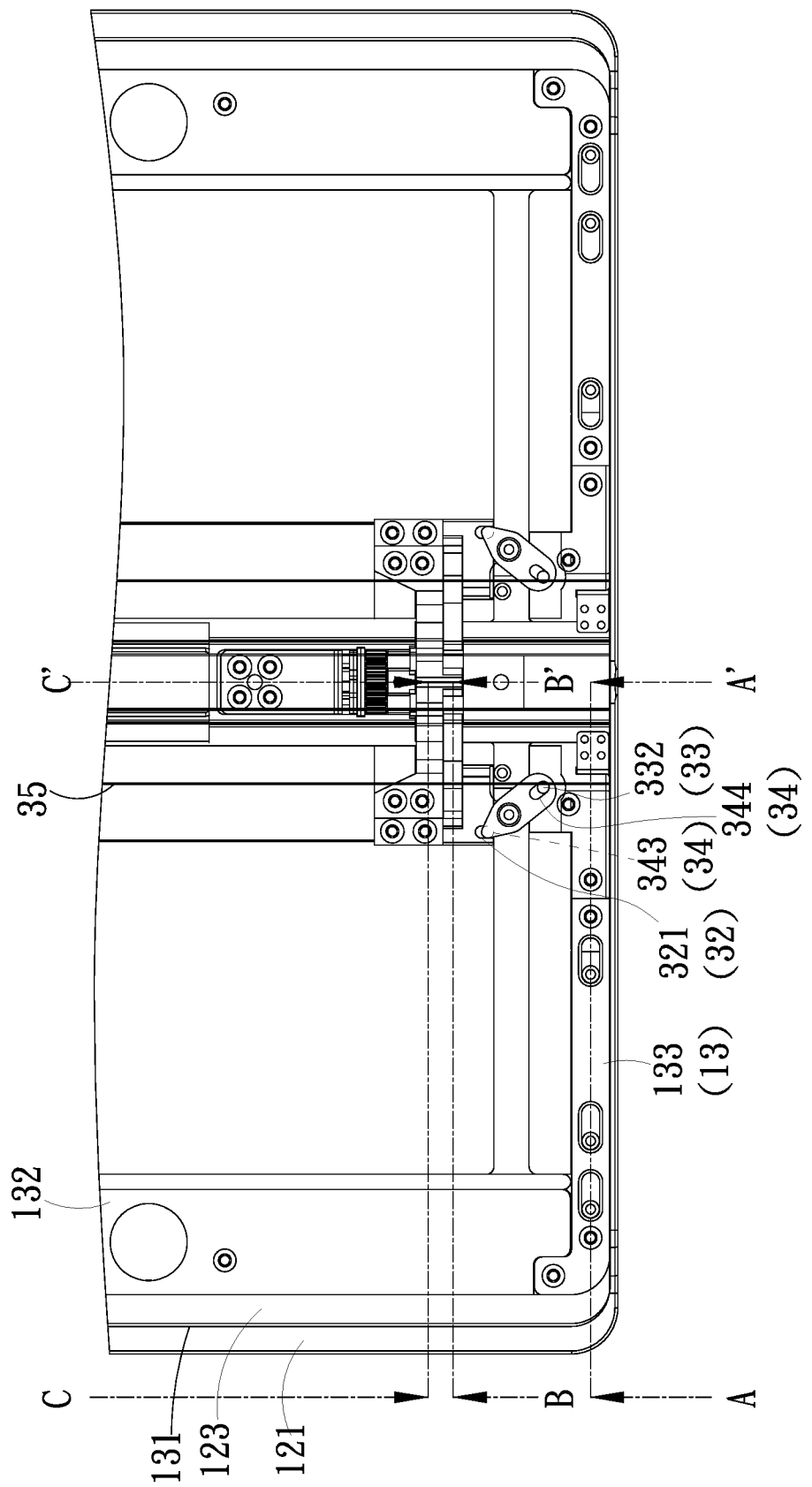
FIG. 5 is a top view illustrating the hinge module being in an unfolded status according to one preferred embodiment of the present invention, wherein each of the transversal moving plates, each of the support plate members and the cover plate being shown in dashed lines.
Figure 6:
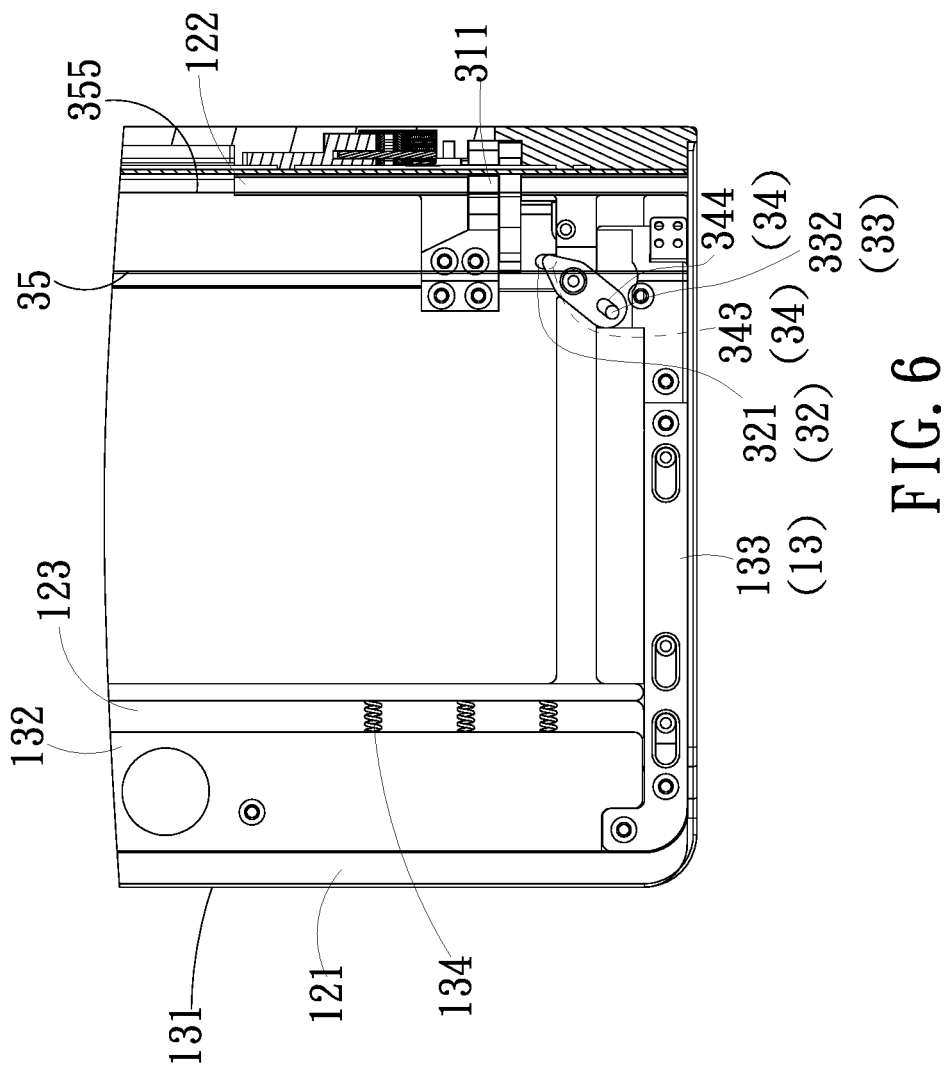
FIG. 6 is a cross sectional top view illustrating the hinge module being in a folded status according to one preferred embodiment of the present invention, wherein said view being crossed from a central location of the base, and the transversal moving plate and each of the support plate members being shown in dashed lines.
Figure 9:
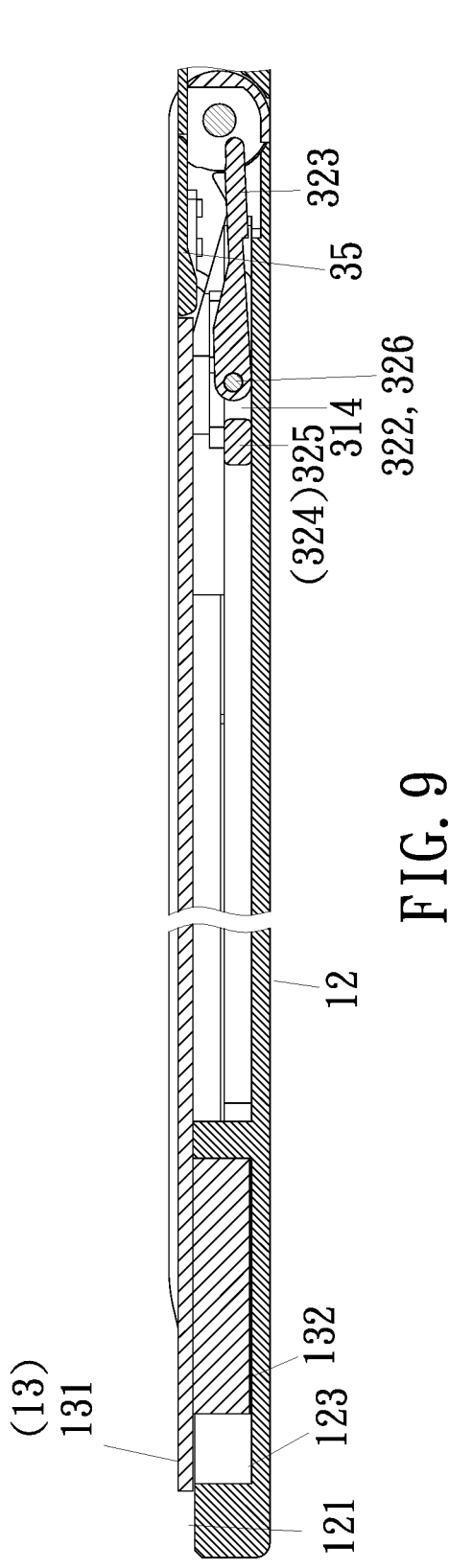
FIG. 9 is a cross sectional view of FIG. 5 taken along a B-B' line.
Figure 10:
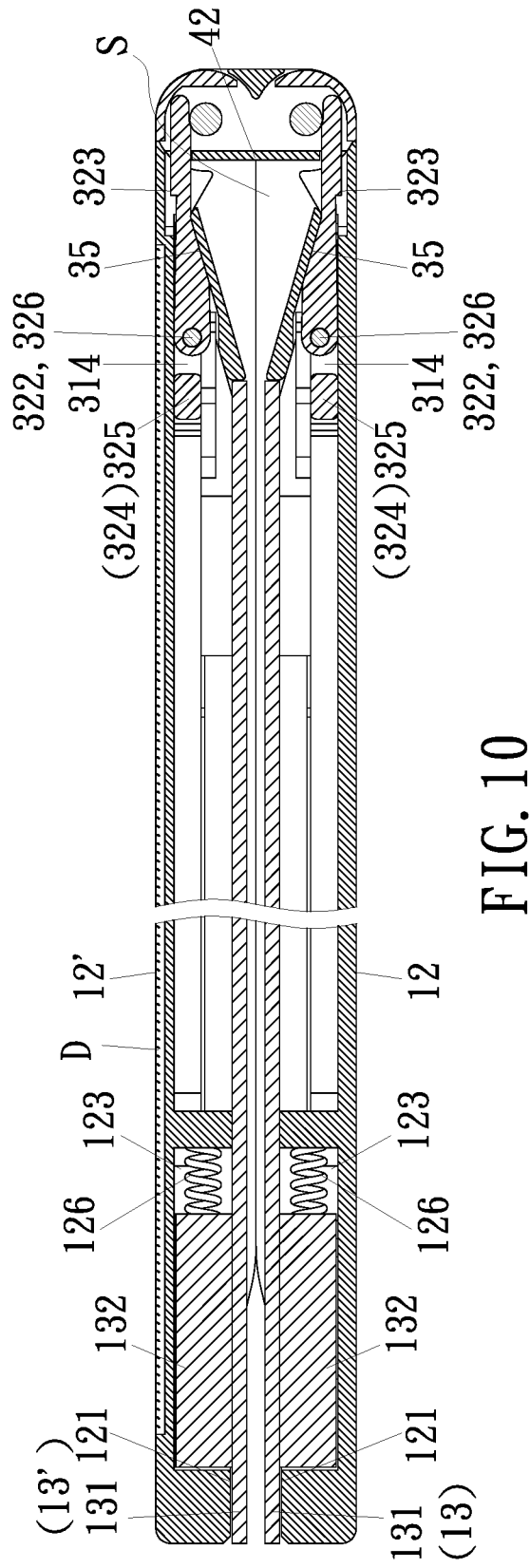
FIG. 10 is a cross sectional view of FIG. 9 after being bent according to the present invention.
Figure 11:
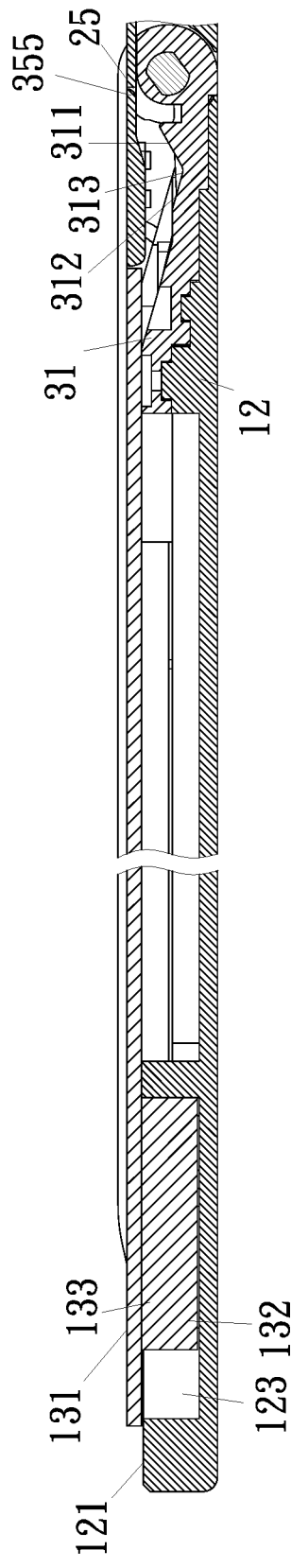
FIG. 11 is a cross sectional view of FIG. 5 taken along a C-C' line.
Figure 12:
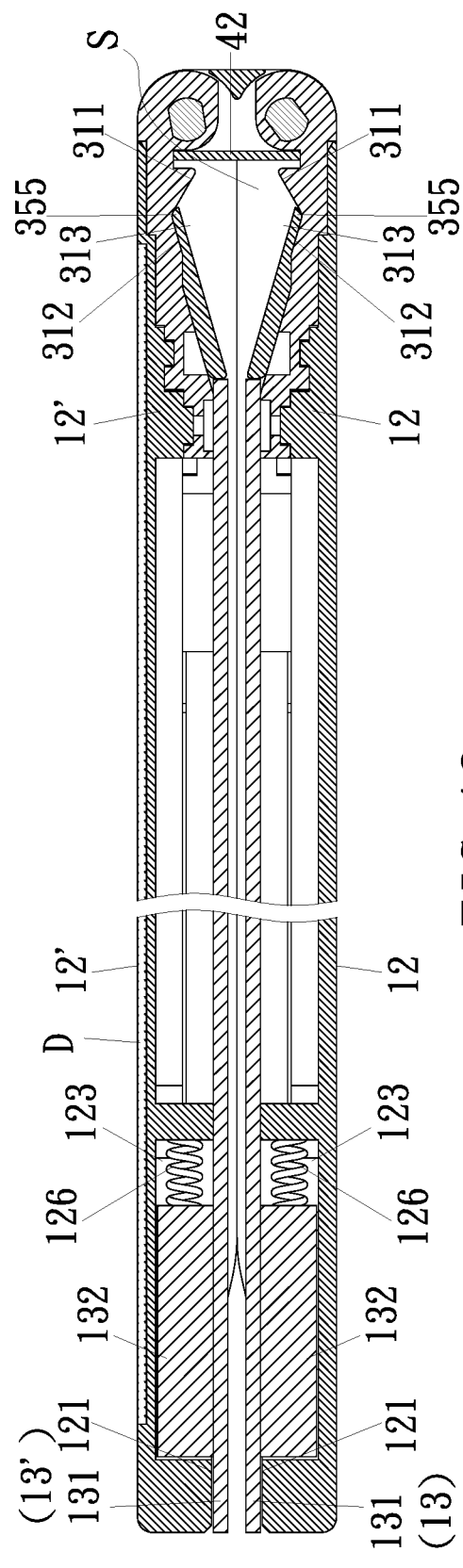
FIG. 12 is a cross sectional view of FIG. 11 after being bent according to the present invention.
Figures 1, 13:
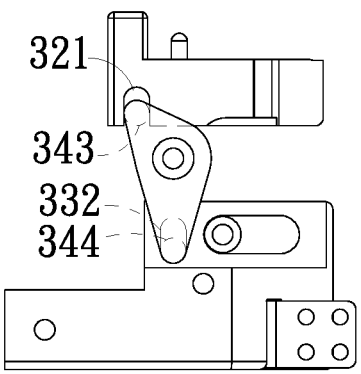
Figures 2, 13:
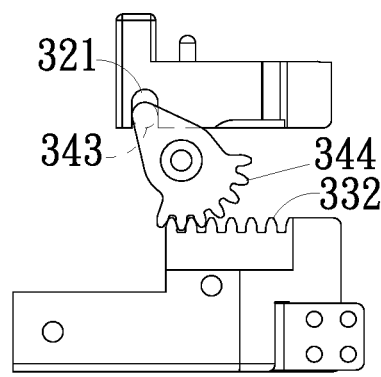
Figures 3, 13:
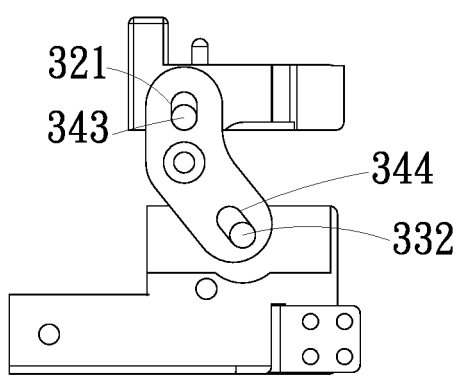
Figures 4, 13:
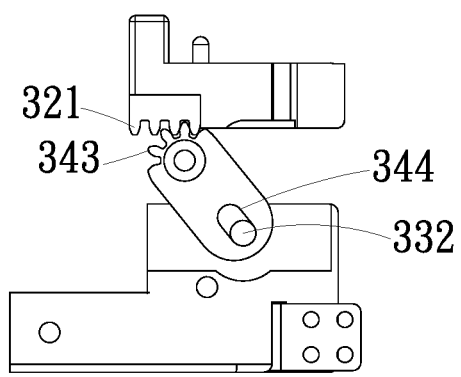
Figures 5, 13:
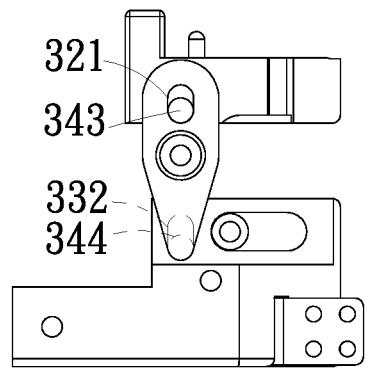
Figures 6, 13:
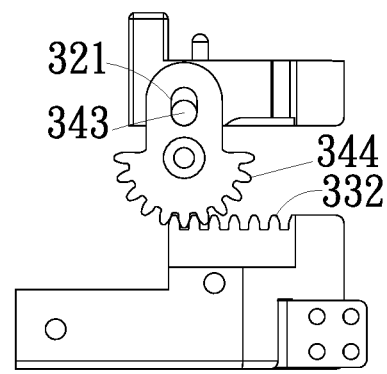
Figures 7, 13:
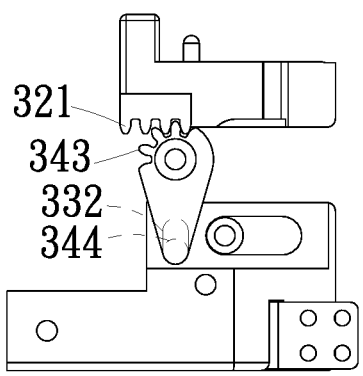
Figures 8, 13:
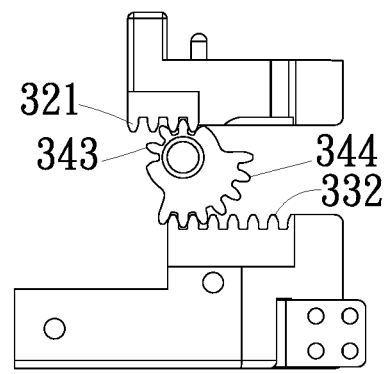
Figure 14:
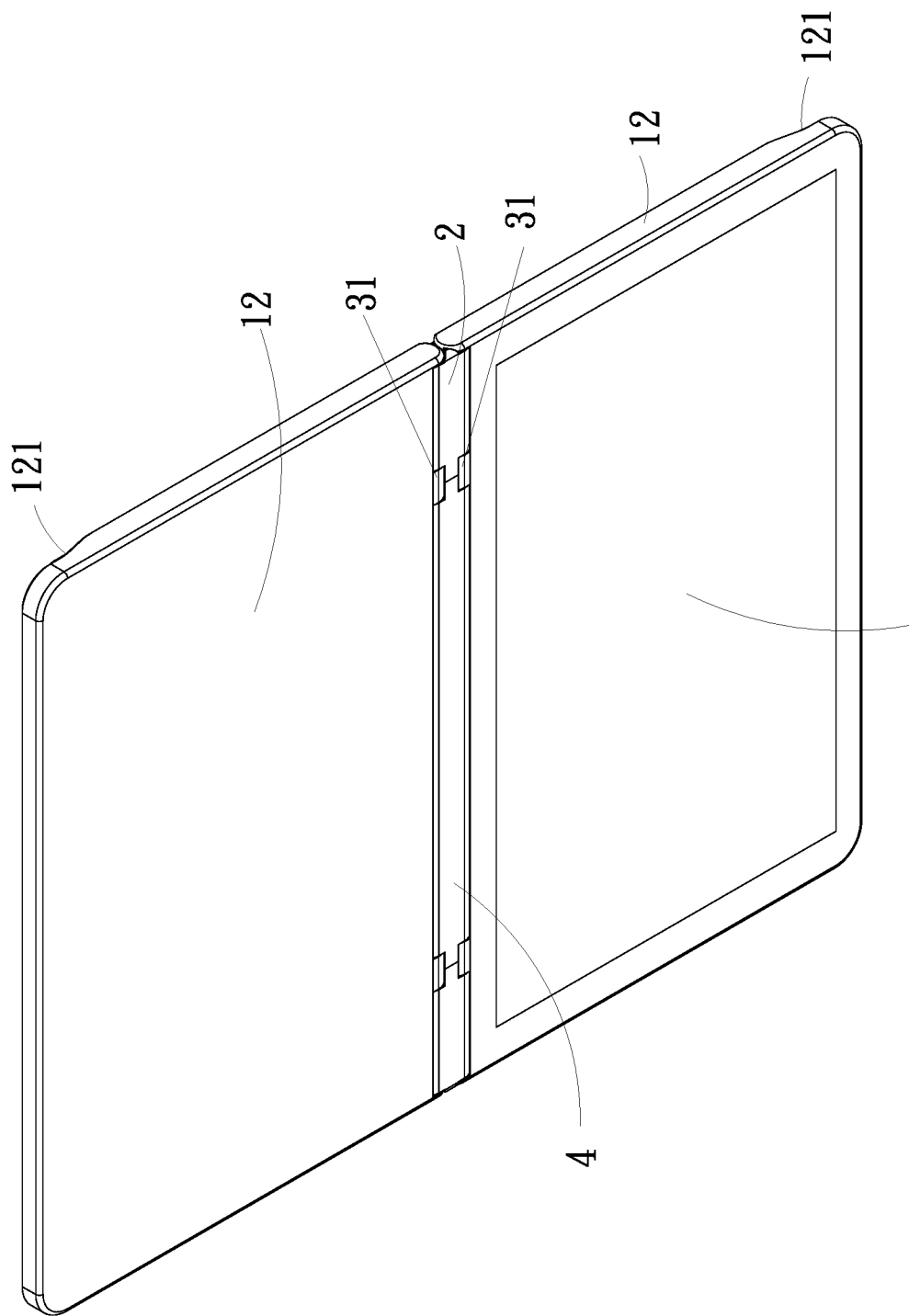
FIG. 14 is a perspective view illustrating the whole structure of the present invention being in an unfolded status, wherein the flexible monitor being removed.

Please refer to FIG. 5, FIG. 13-1 to FIG. 13-8, which illustrate each action zone of the slide mechanisms 3, 3' of the present invention, and embodiments for realizing various technical means shown in FIG. 5 and from FIG. 13-1 to FIG. 13-8 are as follows.

Technical means achieved between the first action zone 321 and the third action zone 343 are illustrated as follows:

1. As shown from FIG. 5, FIG. 13-1 and FIG. 13-2, the first action zone 321 is an elongated guiding slot formed on a plate surface of the linkage plate 324, the third action zone 343 is a column vertically extended from an end part of the middle transmission member 34, so that the column can be mutually linked with the elongated guiding slot with a mean of sliding in the elongated guiding slot.
2. As shown from FIG. 13-3, FIG. 13-5 and FIG. 13-6, the first action zone 321 is a column vertically extended from the plate surface of the linkage plate 324, the third action zone 343 is an elongated guiding slot formed on the end part of the middle transmission member 34, so that the column can be mutually linked with the elongated guiding slot with a mean of sliding in the elongated guiding slot.
3. As shown from FIG. 13-4, FIG. 13-7 and FIG. 13-8, the first action zone 321 is a gear rack formed at a plate side of the linkage plate 324, the third action zone 343 is teeth-shaped structure annularly arranged on a circumference defined at an end part of the middle transmission member 34, so that the gear rack is able to rotate the teeth-shaped structure with an engaging means so as to be synchronously operated with the teeth-shaped structure.

Technical means achieved between the second action zone 332 and the fourth action zone 344 are illustrated as follows:

1. As shown from FIG. 5, FIG. 13-3 and FIG. 13-4, one side of the slide member 33 is extended with a lateral wing sheet 338 in a direction towards the middle transmission member 34, the second action zone 332 is a column vertically extended from a sheet surface of the lateral wing sheet 338, the fourth action zone 344 is an elongated guiding slot formed on another end part of the middle transmission member 34, so that the column can be mutually linked with the elongated guiding slot with a mean of sliding in the elongated guiding slot.
2. As shown from FIG. 13-1, FIG. 13-5 and FIG. 13-7, one side of the slide member 33 is extended with the lateral wing sheet 338 in the direction towards the middle transmission member 34, the second action zone 332 is an elongated guiding slot formed on a sheet surface of the lateral wing sheet 338, the fourth action zone 344 is a column vertically extended from another end part of the middle transmission member 34, so that the column can be mutually linked with the elongated guiding slot with a mean of sliding in the elongated guiding slot.
3. As shown from FIG. 13-2, FIG. 13-7 and FIG. 13-8, one side of the slide member 33 is extended with the lateral wing sheet 338 in the direction towards the middle transmission member 34, the second action zone 332 is a gear rack formed at an edge of the lateral wing plate 338, the fourth action zone 344 is teeth-shaped structure annularly arranged on a circumference defined at another end part of the middle transmission member 34, so that the gear rack is able to rotate the teeth-shaped structure with an engaging means so as to be synchronously operated with the teeth-shaped structure.

Accordingly, with the technical means of respectively adopting the column working with the elongated guiding slot and the gear rack working with the teeth-shaped structure in the first action zone and the third action zone and in the second zone and the fourth zone, the flexibility is provided in terms of design.

Based on what has been disclosed above, advantages achieved by the present invention are as follows:

1. According to the present invention, with the connecting relations and the structural characteristics of the slide member, the support plate member, the linkage member and a convex shaft linkage module and/or a gear module, the compensating folding/unfolding path mechanism can be effectively thinned, thereby simplifying required components so as to reduce the production cost. With the arc-shaped plate pin of the support plate member performing an arc-like swinging movement relative to the arc-shaped guiding slot of the slide member, a free swinging effect similar to an axis-free seesaw can be generated, in other words the actual pivotal connection adopted in the prior art is not required, so that the whole volume can be reduced and the thickness can be thinner, and a thinning effect can be provided; when the whole structure is bent, the accommodation space can be saved for accommodating a bent central portion of the flexible monitor, and a supporting effect can also be provided to the central portion of the flexible monitor while being in a flattened status.

2. According to the present invention, with the gradually-altered recess part respectively formed at the end edge of the two casings, a space allowing a retracting or a entering movement to be performed is provided, so that the displacement of an end edge of the transversal moving plate of the moveable inner casing can be accommodated, and effects of shielding, protecting and prettifying are provided; moreover, when the thin foldable type device is in the folded status, the user can easily unfold the foldable type device via the recess part formed at the end edge of the casing.

3. According to the present invention, when the two casings are relatively rotated for being in the unfolded status, the corresponding block zone at one end of the support plate member can be guided by the guiding surface, so that the corresponding block zone can be smoothly displaced then connected and positioned in the first block part of the base, thereby enabling the two support plate members to upwardly support the flexible monitor at the same time; accordingly, an effect of stable transmission can be ensured when the support plate is bent and deformed.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

What is claimed is:

1. A hinge module for a foldable type device, comprising two casings, an accommodation space being formed between said two casings when said two casings being relatively rotated for being in a folded status or relatively rotated for being in an unfolded status; wherein each of said casings including a fixed outer casing and a moveable inner casing capable of sliding relative to said fixed outer casing; and said hinge module including:

a base, having one end thereof formed with a first pivotal part, a second pivotal part and a first block part; and a slide mechanism, including:

a connection rod, having one end thereof pivoted with said first pivotal part, wherein an opposite end of said connection rod is connected to one side of said fixed outer casing;

a linkage member, having one member thereof pivoted with said second pivotal part, wherein another member of said linkage member is able to relatively displace on said fixed outer casing, said another member is formed with a first action zone, and a pivotal connecting point is formed between the two members of said linkage member;

a slide member, connected to one end of said moveable inner casing and capable of moving relative to said side of said fixed outer casing, wherein said slide member is formed with a second action zone and a connection part, and said connection part is formed with an arc-shaped structure;

a middle transmission member, pivoted to said side of said fixed outer casing, wherein a third action zone and a fourth action zone are formed between two ends of said middle transmission member, said fourth action zone interacts with a said second action zone, said third action zone interacts with a said first action zone, so that said slide member and said linkage member are able to displace towards opposite directions; and a support plate member, having one end thereof formed with a corresponding block zone for being engaged with or separated from said first block part, wherein one side defined at an opposite end of said support plate member has a corresponding arc-shaped structure capable of guiding said arc-shaped structure with a relative arc-like sliding means, so that said support plate member is able to be driven by said slide member to slide for swinging and shifting relative to said slide member, and said moveable inner casing is driven by said slide member for allowing an edge defined at an opposite end of said moveable inner casing to retract or enter a recess part formed on said fixed outer casing.

2. The hinge module for the foldable type device as claimed in claim 1, wherein said first block part is formed as a stepped surface and arranged at one end of said base; after said moveable inner casing is driven to move towards said base, said corresponding block zone of said support plate member is able to be connected to said first block part of said base, so that a swinging movement of said support plate member is restrained, and said base, said support plate member and said moveable inner casing are aligned at a same side; or after said moveable inner casing is driven to backwardly displace, said corresponding block zone is separated from said first block part, so that said support plate member is able to reversely swing and shift so as to form said accommodation space.

3. The hinge module for the foldable type device as claimed in claim 1, wherein one end of said fixed outer casing is formed with a guiding surface; one end of said slide member is formed with an inclined surface; one side of said connection rod is formed with a guiding surface at said end close to said connection rod, and a support surface is formed and adjacent to said guiding surface, so that a concave slot is formed between said support surface and said guiding surface; accordingly, during a process of said support plate member swinging and shifting, said corresponding block zone is sequentially abutted and leaned against each of said guiding surfaces, said support surface and said inclined surface.

4. The hinge module for the foldable type device as claimed in claim 3, wherein said arc-shaped structure of said connection part is formed as an arc-shaped guiding slot, said arc-shaped guiding slot is inwardly recessed from a lateral surface of said slide member and penetrates said inclined surface, said connection part further has a concave slot, a recovery unit and a partition wall; said concave slot is served to receive said recovery unit and communicated to said arc-shaped structure, said partition wall is served to partition an inner space of said concave slot, said corresponding arc-shaped structure is formed as an arc-shaped plate pin which protrudes out from one side of said support plate member and is guided into said arc-shaped structure, a block piece is protruded out from one side of said corresponding arc-shaped structure and guided into said concave slot, so that two ends of said recovery unit are respectively connected to said block piece and said partition wall.

5. The hinge module for the foldable type device as claimed in claim 1, wherein said linkage member further has a linkage auxiliary rod and a linkage plate capable of moving relative to said fixed outer casing, said first action zone is disposed on said linkage plate, one end of said linkage auxiliary rod is pivoted with said second pivotal part, said pivotal connecting point is arranged at a location defined at a pivotal connecting location where an opposite end of said linkage auxiliary rod is pivoted with one side of said linkage plate, another side of said linkage plate is protruded with a wing sheet so as to be guided to a lateral guiding slot at an opposite end of said connection rod.

6. The hinge module for the foldable type device as claimed in claim 5, wherein a convex shaft is protruded from an opposite end of said linkage auxiliary rod, said convex shaft is guided into said lateral guiding slot at said opposite end of said connection rod, said convex shaft and said pivotal connecting point are arranged at a same rotating central line, and said convex shaft is arranged to be parallel to said wing sheet.

7. The hinge module for the foldable type device as claimed in claim 1, wherein a position limiting concave slot is formed at an opposite end of said fixed outer casing, said recess part is arranged at an opposite end of a slot opening of said position limiting concave slot and formed as a gradually-altered stepped surface; said moveable inner casing further has a transversal moving plate having edge frames and a plurality of elastic units; one end of said transversal moving plate is connected to said slide member, so that an opposite end surface of said slide member is adjacent to an end surface of one of said edge frames of said transversal moving plate, said plurality of elastic units are respectively disposed in a plurality of receiving holes formed on another edge frame of said edge frames, thereby allowing said another edge frame to reciprocally displace in said position limiting concave slot in an elastically sliding means, and an edge at an opposite end of said transversal moving plate is able to moveably enter or retract from said recess part.

8. The hinge module for the foldable type device as claimed in claim 1, wherein a third pivotal part, a fourth pivotal part and a second block part are further formed at an opposite end of said base; said second block part is formed as a stepped surface and arranged at an opposite end of said base, so that said third pivotal part, said fourth pivotal part and said second block part, said first pivotal part, said second pivotal part and said first block part are symmetrically arranged at two ends of said base, respectively; said hinge module further includes another slide mechanism, said another slide mechanism and said slide mechanism have corresponding structures and are symmetrically arranged at two ends of said base; wherein, said two casings have corresponding structures and are symmetrically arranged at two ends of said hinge module, and a flexible monitor is disposed at a same side of said hinge module and each of said casings.

9. The hinge module for the foldable type device as claimed in claim 1, wherein an extending base is further disposed between said two casings, a lateral end surface of said extending base is formed with a first position limiting slot and a first hole, said end surface of said connection rod is correspondingly formed with a first protrusion and a first corresponding hole, a spring and a roller interacting with said spring are received in said first hole, said roller is able to be positioned in said first corresponding hole, and said first protrusion is guided for being moveably positioned in said first position limiting slot.

10. The hinge module for the foldable type device as claimed in claim 8, wherein an extending base is further disposed between said two casings, a lateral end surface of said extending base is formed with a first position limiting slot and a first hole, said end surface of said connection rod is correspondingly formed with a first protrusion and a first corresponding hole, a spring and a roller interacting with said spring are received in said first hole, said roller is able to be positioned in said first corresponding hole, and said first protrusion is guided for being moveably positioned in said first position limiting slot.

11. The hinge module for the foldable type device as claimed in claim 9, wherein a base housing and a cover plate covering said base housing are further disposed in said extending base; said base housing is concavely formed with at least one installation slot and at least one accommodation slot, said at least one installation slot is able to correspondingly receive a hinge, and said at least one accommodation slot is able to accommodate at least one electric wiring and allows said at least one electric wiring to pass.

12. The hinge module for the foldable type device as claimed in claim 10, wherein a base housing and a cover plate covering said base housing are further disposed in said extending base; said base housing is concavely formed with at least one installation slot and at least one accommodation slot, said at least one installation slot is able to correspondingly receive a hinge, and said at least one accommodation slot is able to accommodate at least one electric wiring and allows said at least one electric wiring to pass.

13. The hinge module for the foldable type device as claimed in claim 9, wherein a second position limiting slot and a second hole are formed on a lateral surface defined at an opposite end of said extending base, a second protrusion and a second corresponding hole are correspondingly formed on an end surface of a connection rod of said another slide mechanism, a spring and a roller interacting with said spring are received in said second hole, said roller is able to be positioned in said second corresponding hole, said second protrusion is guided into said second positioning limiting slot in a sliding means.

14. The hinge module for the foldable type device as claimed in claim 10, wherein a second position limiting slot and a second hole are formed on a lateral surface defined at an opposite end of said extending base, a second protrusion and a second corresponding hole are correspondingly formed on an end surface of a connection rod of said another slide mechanism, a spring and a roller interacting with said spring are received in said second hole, said roller is able to be positioned in said second corresponding hole, said second protrusion is guided into said second positioning limiting slot in a sliding means.

15. The hinge module for the foldable type device as claimed in claim 8, wherein an adhering layer is further provided between said flexible monitor and same sides of said moveable inner casing of each of said casings, said support plate member of each of said slide mechanisms and said base; said adhering layer has a first adhering zone, a second adhering zone and a third adhering zone; said first adhering zone is provided at one side of said moveable inner casing of said casing and a partial portion at one side of said support plate member of said slide mechanism, said second adhering zone is provided at one side of said moveable inner casing of said another casing and a partial portion at one side of said support plate member of said another slide mechanism, and said third adhering zone is provided at a central portion at one side of said base.

16. The hinge module for the foldable type device as claimed in claim 5, wherein said first action zone is an elongated guiding slot formed on a plate surface of said linkage plate, said third action zone is a column vertically extended from an end part of said middle transmission member, so that said column is able to be mutually linked with said elongated guiding slot with a mean of sliding in said elongated guiding slot.

17. The hinge module for the foldable type device as claimed in claim 5, wherein said first action zone is a column vertically extended from said plate surface of said linkage plate, said third action zone is an elongated guiding slot formed on said end part of said middle transmission member, so that said column is able to be mutually linked with said elongated guiding slot with a mean of sliding in said elongated guiding slot.

18. The hinge module for the foldable type device as claimed in claim 5, wherein said first action zone is a gear rack formed at a plate side of said linkage plate, said third action zone is a teeth-shaped structure annularly arranged on a circumference defined at an end part of said middle transmission member, so that said gear rack is able to rotate said teeth-shaped structure with an engaging means so as to be synchronously operated with said teeth-shaped structure.

19. The hinge module for the foldable type device as claimed in claim 1, wherein one side of said slide member is extended with a lateral wing sheet in a direction towards said middle transmission member, said second action zone is a column vertically extended from a sheet surface of said lateral wing sheet, said fourth action zone is an elongated guiding slot formed on another end part of said middle transmission member, so that said column is able to be mutually linked with said elongated guiding slot with a mean of sliding in said elongated guiding slot.

20. The hinge module for the foldable type device as claimed in claim 1, wherein one side of said slide member is extended with a lateral wing sheet in a direction towards said middle transmission member, said second action zone is an elongated guiding slot formed on a sheet surface of said lateral wing sheet, said fourth action zone is a column vertically extended from another end part of said middle transmission member, so that said column is able to be mutually linked with said elongated guiding slot with a mean of sliding in said elongated guiding slot.

21. The hinge module for the foldable type device as claimed in claim 1, wherein one side of said slide member is extended with a lateral wing sheet in a direction towards said middle transmission member, said second action zone is a gear rack formed at an edge of said lateral wing plate, said fourth action zone is a teeth-shaped structure annularly arranged on a circumference defined at another end part of said middle transmission member, so that said gear rack is able to rotate said teeth-shaped structure with an engaging means so as to be synchronously operated with said teeth-shaped structure.

\* \* \* \* \*